United States Patent
Lenssen et al.

(10) Patent No.: US 6,465,053 B1
(45) Date of Patent: Oct. 15, 2002

(54) METHOD FOR MANUFACTURING A MAGNETIC DEVICE

(76) Inventors: Kars-Michiel Hubert Lenssen, Prof. Holstlaan 6, 5656 AA Eindhoven (NL); Antonius Emilius Theodorus Kuiper, Prof. Holstlaan 6, 5656 AA Eindhoven (NL); Joannes Baptist Adrianus Dionisius Van Zon, Prof. Holstlaan 6, 5656 AA Eindhoven (NL)

( * ) Notice: Subject to any disclaimer, the term of this patent is extended or adjusted under 35 U.S.C. 154(b) by 0 days.

(21) Appl. No.: 09/763,207
(22) PCT Filed: Jun. 15, 2000
(86) PCT No.: PCT/EP00/05510
§ 371 (c)(1), (2), (4) Date: Feb. 16, 2001
(87) PCT Pub. No.: WO00/79297
PCT Pub. Date: Dec. 28, 2000

(30) Foreign Application Priority Data

Jun. 18, 1999 (EP) .............................................. 99201961

(51) Int. Cl.[7] .................................................. H01F 1/00
(52) U.S. Cl. ........................ 427/548; 427/131; 427/132; 427/547; 427/598; 427/599
(58) Field of Search .................................. 427/132, 131, 427/599, 598, 547, 548

(56) References Cited

U.S. PATENT DOCUMENTS

| | | | |
|---|---|---|---|
| 5,561,368 A | 10/1996 | Dovek et al. | 324/252 |
| 5,686,837 A | 11/1997 | Coehoorn et al. | 324/252 |

*Primary Examiner*—Bernard Pianalto
(74) *Attorney, Agent, or Firm*—Steven R. Biren

(57) ABSTRACT

Magnetic field sensors and magnetic memories have at least two magnetoresistive bridge elements (A,B,C,D), wherein each magnetoresistive element comprises a free (F) and a pinned (P) ferromagnetic layer. The magnetization directions of pinned ferromagnetic layers are different for the two bridge elements. In the method, in a first deposition step, a first ferromagnetic layer of one of the two said elements is deposited, during which deposition a magnetic field is applied to pin the magnetization direction MP in the first ferromagnetic layer in a first direction. Then, in a second deposition step, a second ferromagnetic layer of the other of the two said elements is deposited, during which deposition a magnetic field is applied to pin the magnetization direction in the second ferromagnetic layer in a second direction different from, preferably opposite to, the magnetization direction in the first ferromagnetic layer.

7 Claims, 3 Drawing Sheets

METHOD FOR MANUFACTURING A MAGNETIC DEVICE

BACKGROUND OF THE INVENTION

The invention relates to a method of manufacturing a magnetic field sensor or magnetic memory having at least two magnetoresistive bridge elements in a (half)Wheatstone bridge arrangement, each magnetoresistive element comprising a free and a pinned ferromagnetic layer, said at least two bridge elements having pinned ferromagnetic layers with different magnetization directions.

Such a method is known from U.S. Pat. No. 5,561,368.

U.S. Pat. No. 5,561,368 describes a method of manufacturing a magnetic sensor having a full Wheatstone bridge arrangement in which each adjacent resistor element has an equal but opposite response to an applied magnetic field. Each sensor element comprises a pinned and a free ferromagnetic layer, and pinned ferromagnetic layers of adjacent elements have opposite relative magnetization directions. The magnetic direction of the pinned ferromagnetic layers is pinned by means of a conductive fixing layer which is provided electrically insulated above the resistor elements. A current through the conductive fixing layer generates a magnetic field which pins the magnetic direction of the pinned ferromagnetic layers.

Many sensor applications require the use of a Wheatstone-bridge configuration, to eliminate the unwanted resistance change due to temperature variations. Whereas for sensors based on the Anisotropic Magnetoresistance (AMR) effect a Wheatstone-bridge can be elegantly realized using barber-pole structures, for Giant Magnetoresistance (GMR) and Tunneling Magnetoresistance (TMR) this is not simple at all. So far the following possibilities have been proposed:

1. Two (of the four) bridge elements are magnetically shielded; the shields may be used as flux concentrators for the two sensitive elements. However, only two of the bridge elements are then effectively used, which reduces the output signal.

2. An insulated conductor is integrated below or over the sensor elements (consisting of exchange-biased spin valves) to induce a magnetic field that 'sets' the exchange-biasing direction of the elements in opposite directions, while the elements are heated above the blocking temperature of the exchange-biasing material. A comparable method with an integrated conductor has been proposed for elements based on an Artificial Antiferromagnet (AAF). This method is used in U.S. Pat. No. 5,561,368.

3. In the factory the magnetizations are set in opposite directions in different branches of the bridges by exposing the wafer with sensor structures to an external magnetic field that is induced by a kind of 'stamp' comprising a pattern of current carrying conductors which is brought in the vicinity of the wafer. This method is in some sense equivalent to the method described sub 2.

All these possibilities are rather complicated and require quite some effort in practice. Moreover, the possibility mentioned sub 1 only allows the realization of a half-bridge and therefore loses half of the possible output signal. The magnetic fields that can be realized with the options 2 and 3 are very limited in strength, because the currents have to be relatively small in the (necessarily narrow and thin) conductors. Furthers, option 1 and 2 require several extra processing steps (both for patterning and insulation of the conductors or shields), which makes the sensors more expensive and reduces the manufacture yield. If option 3 is used, the sensor may be destroyed if exposed to a magnetic field of the same strength (or larger) as the field used during setting of the magnetization directions. In this case (after packaging) it is almost impossible to reset the sensor, certainly without the specific magnetization device.

The robustness of the sensor elements becomes more and more important, in particular for automotive applications, but also for read heads. This trend makes setting of the magnetization directions after deposition of the elements more and more difficult. For example, GMR material very suitable for automotive sensor applications shows no rotation of the exchange-biasing direction when exposed to a magnetic field of approximately 50 kA/m at temperatures up to 450° C. It is difficult to generate fields of such strength by the above method 2 or 3. An intentional reduction of the robustness of the material, however, would degrade the characteristics of the sensor, which poses a problem in particular for automotive applications.

SUMMARY OF THE INVENTION

It is an object of the invention to provide a manufacturing method as given in the opening paragraph which resolves at least partially or preferably eliminates some or all of the above-mentioned problems.

To this end, the method in accordance with the invention is characterized in that in a first deposition step a first ferromagnetic layer of one of the two said elements is deposited, during which deposition a magnetic field is applied to pin the magnetization direction in the first ferromagnetic layer in a first direction, after which in a second deposition step a second ferromagnetic layer of the other of the two said elements is deposited, during which deposition a magnetic field is applied to pin the magnetization direction in the second ferromagnetic layer in a second direction different from, preferably opposite to the magnetization direction in the first ferromagnetic layer.

In the method of the invention the at least two pinned ferromagnetic layers are fabricated in at least two separate deposition steps, and during the deposition steps magnetic fields are generated by which opposite magnetic directions are imparted to the said pinned ferromagnetic layers. Preferably this is achieved by using magnetic fields of opposing directions during the first and second deposition step. This method is simpler than methods in which magnetic fields are used with the same direction but in which the position of the device is changed.

Although the method is useful for devices having elements with anisotropic magnetoresistance, it is of particular usefulness for devices which use the Giant MagnetoResistance effect (GMR) or Tunneling MagnetoResistance effect (TMR).

Preferably, the magnetic field applied during the second deposition has a direction different from, preferably opposite to, the direction of the field applied during the first deposition, while the position of the device during deposition is the same. Alternatively, but less favored, the magnetic field applied during deposition is the same, but the position of the device is changed between depositions to achieve the same result. Although the method is applicable to the manufacture of a device having a half-Wheatstone bridge arrangement, it is of particular importance for a device having four bridge elements in a Wheatstone bridge arrangement.

A Wheatstone bridge arrangement comprises at least four bridge elements in a bridge arrangement.

A further embodiment of the invention is characterized in that two Wheatstone bridge elements are manufactured, the magnetic directions of the corresponding elements enclosing an angle with each other, preferably of 90°.

BRIEF DESCRIPTION OF THE DRAWING

These and further aspects of the inventions will be apparent from and elucidated with reference to the embodiments described hereafter. In the drawings.

The Figures are diagrammatic and not drawn to scale, and corresponding parts have been given the same reference numerals.

DESCRIPTION OF THE PREFERRED EMBODIMENTS

Figure 1:
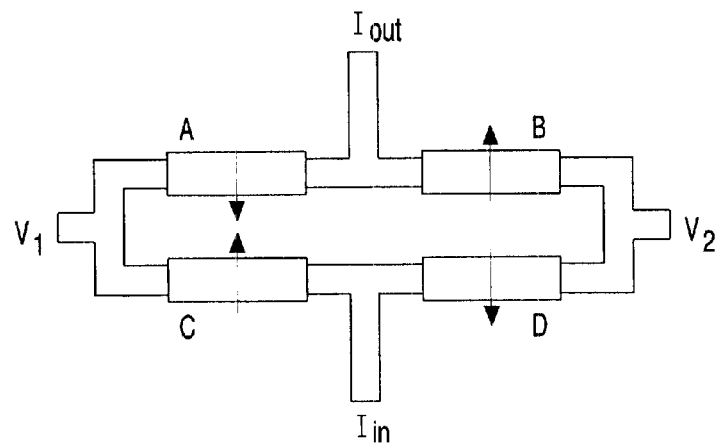
FIG. 1 is a diagrammatic plan view of part of a device made in accordance with the method of the invention.

FIG. 1 is a diagrammatic plan view of part of a device made in accordance with the method of the invention.

The embodiment shown in FIG. 1 comprises four bridge elements A, B, C and D in a Wheatstone bridge arrangement. Each of these elements comprises a free ferromagnetic layer and a pinned ferromagnetic layer separated by a spacer or separating layer. The magnetic direction in each of the pinned layers of the respective elements is indicated by an arrow in FIG. 1. Adjacent elements (within the Wheatstone bridge arrangement) have opposite magnetic directions for the pinned layers.

Figure 2:
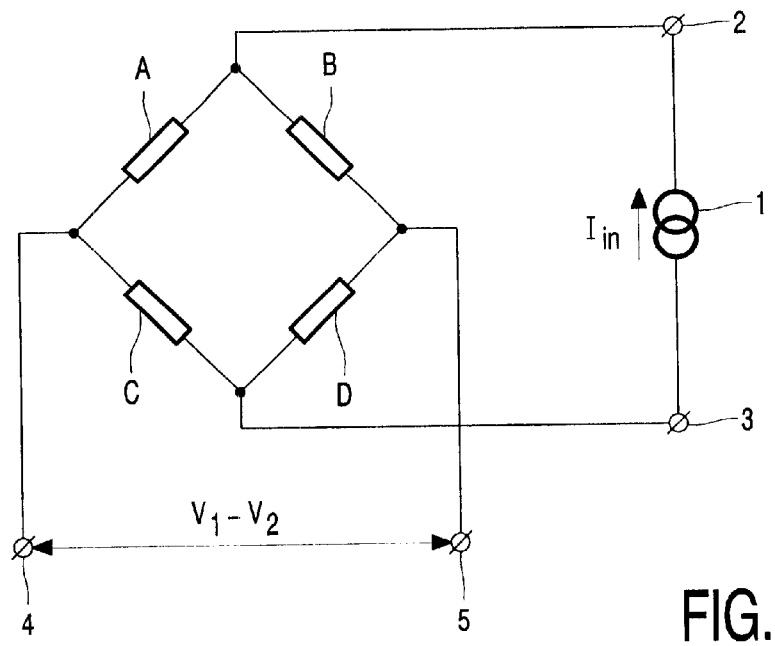
FIG. 2 shows a Wheatstone bridge arrangement.
Figure 3:
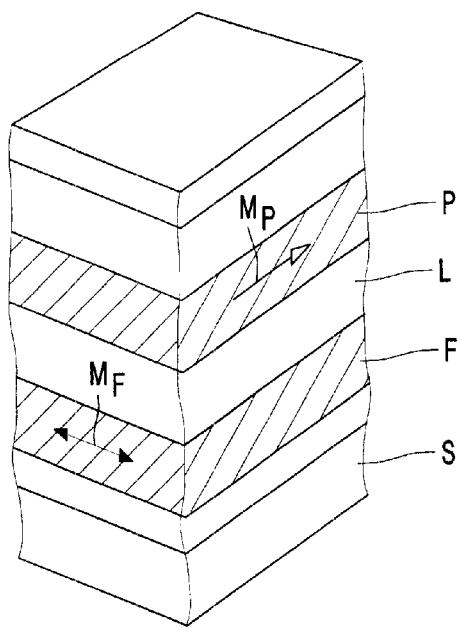
FIG. 3 is a simplified view of a part of a magnetoresistive sensor element.
Figure 3:
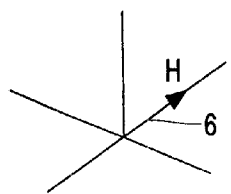

For example, a bridge structure as shown in FIG. 1 could be realized as follows. First a GMR film is deposited en a substrate while a magnetic field is applied in the downward direction (at least during deposition of the pinned layer; for the free layer the field may be rotated through 90° to reduce hysteresis). Elements A and D are defined and manufactured from this film by lithographic techniques. After that, a GMR film is deposited for the second time, but now the field is applied in the upward direction. This film is patterned into the elements B and C. Finally, contact leads can be added in a third lithographic step. In this method it is preferred that the GMR films of both depositions have the same magnetoresistive properties. FIG. 2 shows the equivalent diagram of a Wheatstone bridge, having magnetoresistive sensor elements A, B, C and D in accordance with the invention, and a current source 1 for a current $I_{in}$ connected to terminals 2 and 3. The output voltage V1–V2 is present across terminals 4 and 5. The bridge can be operated by voltage control or current control. In comparison with voltage control, the current control shown here offers the advantage that a decrease in the output voltage V1–V2 in the event of increasing temperatures due to a decrease of the relative magnetoresistive effect is satisfactorily compensated for by an increase of the absolute value of the magnetoresistive elements A, B, C and D in the bridge, which is caused by a positive temperature coefficient of the resistive material. FIG. 3 shows the construction of part of a magnetoresistive sensor element which can be used according to the invention. Arrow MF in FIG. 3 denotes the direction of the anisotropy axis of free ferromagnetic layer F and an arrow NW denotes the direction of the magnetization of pinned ferromagnetic layer P. Layers F and P are separated by a non-ferromagnetic layer L. The element is provided on a substrate S. An arrow 6 denotes the component of a magnetic field H to be measured which is directed parallel to the magnetization direction of the second NiFe layer P. In the magnetoresistive elements A, B, C and D, the easy magnetization direction of the sensitive ferromagnetic material of the layer F extends substantially perpendicularly to the magnetization direction of the ferromagnetic layer P. During the manufacture of the sensor elements the magnetization directions of the ferromagnetic layers (32 and 34) are laid down such that two elements in two adjacent (in the circuit diagram) branches of the bridge exhibit mutually opposed sensitivities to external magnetic fields. The layers may be deposited by various known method such as sputter deposition, MBE (Molecular Beam Epitaxy), or ion beam deposition. During deposition a magnetic field is applied which determines the magnetic direction of the layer. Moreover, the magnetization of a ferromagnetic layer F in each magnetoresistive sensor element is adjusted substantially perpendicularly to the magnetization direction of the other ferromagnetic layer P. These steps achieve that auxiliary fields are no longer required for the measurement of small magnetic fields, that the sensor is substantially free of hysteresis, and that it has an enhanced linearity.

The free layer may be a single CoFe layer, or a plurality of sublayers (e.g. CoFe+NiFe CoFe+NiFe+CoFe, etc.) Instead of CoFe, Co or CoNiFe may be used, but if CoNiFe is used, it should preferably not be contiguous with the Cu spacer layer. The AAF may comprise a plurality of ferromagnetic and non-magnetic layers. Each ferromagnetic pinned layer may be composed as described with respect to the free layer. The sensor may comprise a combination of two pinned ferromagnetic layers and a free ferromagnetic layer. The device can also be used as a data storage cell. An angle set between the magnetization directions of the free and the pinned layer is representative of e.g. a "0" or a "1". The data content can be read out by measuring the resistance of the memory cell.

Summarizing, the invention relates to a method of manufacturing a multilayer sensor device comprising a free and a pinned ferromagnetic layer, which can withstand high temperatures and strong magnetic fields as required in, for instance, automotive applications.

Test experiments have shown that it is possible to realize GMR elements with opposite exchange-biasing directions on the same substrate by this method.

The following advantages are obtained:

Also applicable to materials with robust exchange-biasing.

Full Wheatstone-bridge configuration possible.

No integrated conductors for setting the magnetization directions (requiring several extra processing steps) are needed.

This method places no limit on the smallest dimensions in the sensor structure.

Elements belonging to different bridge branches can be distributed alternatingly over the area.

Possibility to stack elements on top of each other (with insulation in between), thus reducing the total area of the sensor by a factor of 2 and improving the performance of the bridge (due to smaller influences of temperature or field gradients).

Alternatively, elements can be positioned at both sides of the substrate.

Figure 4:
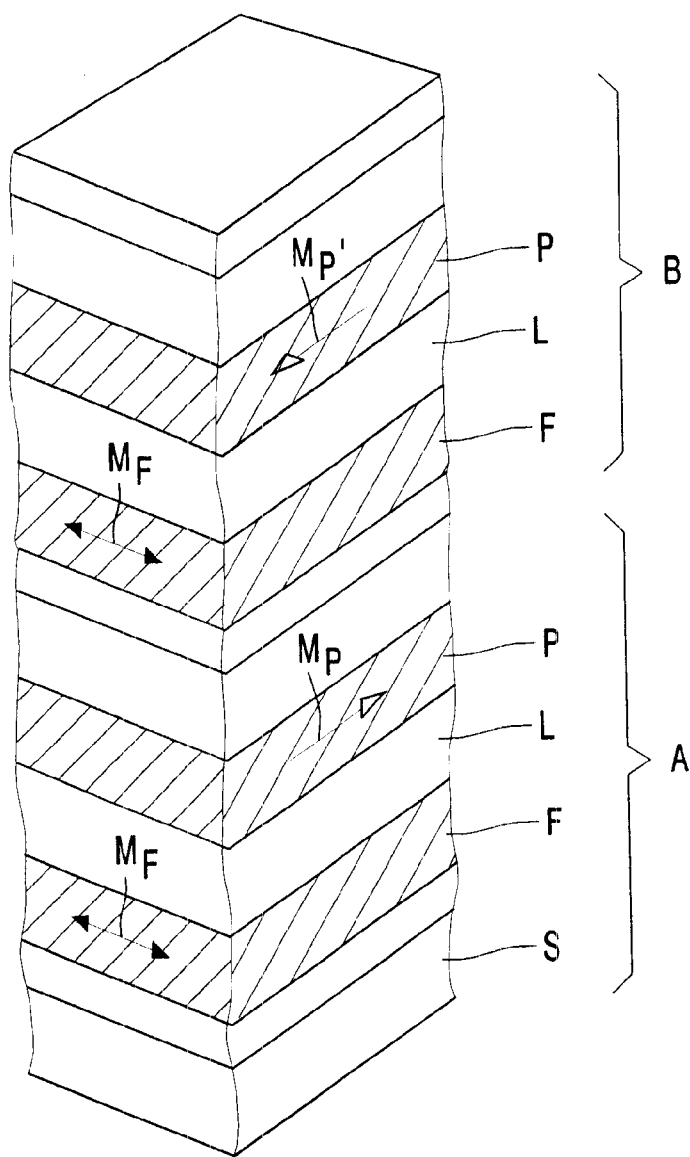
FIG. 4 is a simplified view of parts of two magnetoresistive elements stacked on top of each other.
Figure 4:
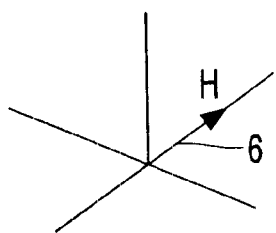

The penultimate possibility mentioned is diagrammatically shown in FIG. 4. The bridge elements A and B are stacked on top of each other, the magnetization directions MP, MP' of the pinned layers P in elements A and B are of opposite direction.

Figure 5:
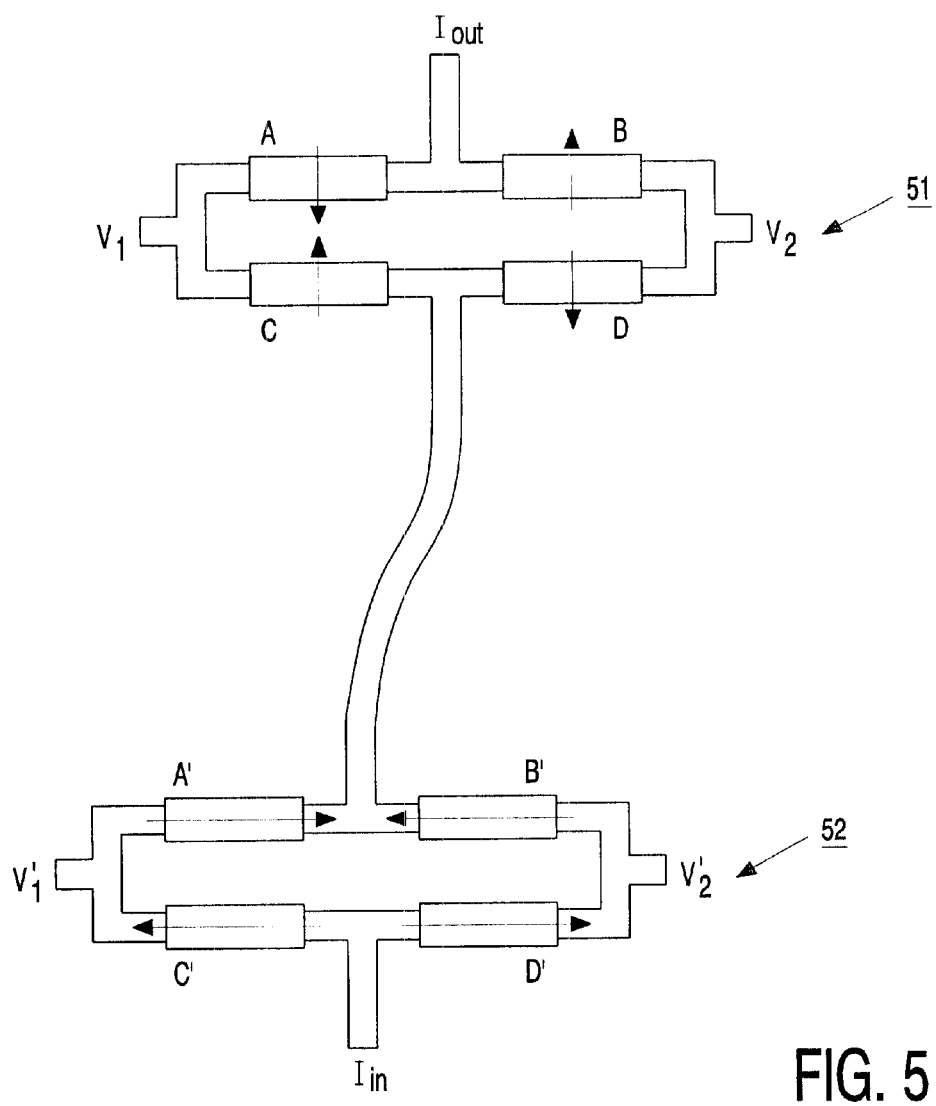
FIG. 5 is a simplified view of an arrangement comprising two Wheatstone bridge arrangements in which the magnetization direction in corresponding elements are under an angle of 90°.

FIG. 5 diagrammatically shows an embodiment in which two Wheatstone bridges 51 and 52 are made. The magnetization directions of the pinned layers A', B', C' and D' in Wheatstone bridge 52 are oriented at an angle of 90° to the corresponding elements in Wheatstone bridge 51. Such an arrangement can be advantageously used, for example, to measure rotating magnetic fields. The signals V1–V2 and V1'–V2' render possible a measurement of the magnitude as well as of the angle (orientation) of the magnetic field to be measured. If the field to be measured is so strong that the directions of the magnetization of the free layers follow the direction of the magnetic field to be measured, the signals are a measure of the orientation of the magnetic field independent of the strength of the magnetic field. The use of two Wheatstone bridges in which the magnetization directions in corresponding elements enclose an angle with each other, preferably of, but not restricted to, 90° renders it possible to measure the direction of the magnetic field over the full 360° range. In all examples the directions of magnetization or of anistropic axes are indicated as lying in the plane of the films and being substantially opposite to each other (at least within one Wheatstone bridge arrangement). Although such methods and arrangements are preferred and advantageous, the invention, in its broadest sense, also covers methods in which the magnetization directions are different, which includes angles different from 180°, for instance 90°. Also the directions need not necessarily lie in the plane of the layers, they may lie or have a component transverse to the layers.

Fields of Application

The invention can be widely used in the manufacture of bridge sensors based on GMR or tunneling magnetoresistance (and even anisotropic magnetoresistance). In particular, it enables the realization of a full Wheatstone bridge with thermally and magnetically robust material, as is desired for automotive applications. It is also useful for manufacturing magnetic memories (MRAMs) having at least two bridge elements as described above. For MRAMs in particular, the advantages of robustness and miniaturization (including stacking elements on top of each other) are of particular importance.

What is claimed is:

1. A method of manufacturing a magnetic field sensor or magnetic memory having at least two magnetoresistive bridge elements (A,B,C,D), each magnetoresistive element comprising a free (F) and a pinned (P) ferromagnetic layer, said at least two bridge elements having pinned ferromagnetic layers with different magnetization directions, comprising depositing, in a first deposition step, a first ferromagnetic layer of one of the at least two said elements, applying a magnetic field during said first deposition step to pin the magnetization direction MP in the first ferromagnetic layer in a first direction, then, in a second deposition step, depositing a second ferromagnetic layer of the other of the two said elements, and applying a magnetic field during said second deposition step to pin the magnetization direction in the second ferromagnetic layer in a second direction different from the magnetization direction in the first ferromagnetic layer.

2. A method as claimed in claim 1, wherein the bridge elements are Giant MagnetoResistance (GMR) or Tunneling MagnetoResistance (TMR) bridge elements.

3. A method as claimed in claim 1, wherein magnetic fields of opposing direction are applied during the first and the second deposition step.

4. A method as claimed in claim 1, wherein a device comprising a full Wheatstone bridge arrangement is manufactured.

5. A method as claimed in claim 1, wherein the two bridge elements are provided on top of each other.

6. A method as claimed in claim 1, wherein two full Wheatstone bridge arrangements are provided, the magnetization directions in corresponding elements of the Wheatstone bridges being pinned at different angles.

7. A method as claimed in claim 1, wherein said second direction is opposite to the magnetization direction in the first ferromagnetic layer.

* * * * *

UNITED STATES PATENT AND TRADEMARK OFFICE
CERTIFICATE OF CORRECTION

PATENT NO.     : 6,465,053 B1
DATED          : October 15, 2002
INVENTOR(S)    : Kars-Michiel Hurbert Lenssen et al.

It is certified that error appears in the above-identified patent and that said Letters Patent is hereby corrected as shown below:

<u>Title page,</u>
Insert item -- [73] Assignee: Koninklijke Philips Electronics N.V., Eindhoven (NL) --.

Signed and Sealed this

Twenty-first Day of October, 2003

JAMES E. ROGAN
*Director of the United States Patent and Trademark Office*